(12) United States Patent
Ban

(10) Patent No.: US 9,891,396 B2
(45) Date of Patent: Feb. 13, 2018

(54) OPTICAL MODULE

(71) Applicant: Oclaro Japan, Inc., Kanagawa (JP)

(72) Inventor: Takuma Ban, Kanagawa (JP)

(73) Assignee: OCLARO JAPAN, INC., Kanagawa (JP)

( * ) Notice: Subject to any disclaimer, the term of this patent is extended or adjusted under 35 U.S.C. 154(b) by 0 days.

(21) Appl. No.: 15/073,686

(22) Filed: Mar. 18, 2016

(65) Prior Publication Data

US 2016/0286657 A1    Sep. 29, 2016

(30) Foreign Application Priority Data

Mar. 24, 2015  (JP) .................. 2015-060524

(51) Int. Cl.

| | |
|---|---|
| *G02B 6/36* | (2006.01) |
| *H01P 1/00* | (2006.01) |
| *H01P 5/00* | (2006.01) |
| *H04B 10/00* | (2013.01) |
| *G02B 6/42* | (2006.01) |
| *H05K 1/11* | (2006.01) |
| *H05K 3/36* | (2006.01) |
| *H05K 1/14* | (2006.01) |

(52) U.S. Cl.
CPC ......... *G02B 6/4278* (2013.01); *G02B 6/4281* (2013.01); *H05K 1/118* (2013.01); *H05K 3/363* (2013.01); *H05K 1/115* (2013.01); *H05K 1/117* (2013.01); *H05K 1/147* (2013.01); *H05K 1/148* (2013.01); *H05K 3/366* (2013.01); *H05K 2201/10121* (2013.01); *H05K 2201/10303* (2013.01)

(58) Field of Classification Search
CPC .... G02B 6/4279; G02B 6/428; G02B 6/4281; G02B 6/4283; G02B 6/4284; H05K 1/14; H05K 1/141; H05K 1/144; H05K 3/362
USPC .............. 385/88, 92, 94; 333/245, 246, 260; 228/179.1, 180.21; 439/59, 65
See application file for complete search history.

(56) References Cited

U.S. PATENT DOCUMENTS

| | | | |
|---|---|---|---|
| 6,378,757 B1 * | 4/2002 | Holcombe ............. | H05K 3/363 228/166 |
| 7,130,194 B2 * | 10/2006 | Togami ................ | G02B 6/4246 361/715 |
| 9,638,876 B2 * | 5/2017 | Schamuhn ........... | G02B 6/4284 |

(Continued)

FOREIGN PATENT DOCUMENTS

JP    2012-018289 A    1/2012

*Primary Examiner* — Robert Tavlykaev

(74) *Attorney, Agent, or Firm* — Mattingly & Malur, PC

(57) ABSTRACT

An electrical interface includes an insulating body, first electrodes, and second electrodes. The insulating body includes a first front edge surface and a second front edge surface facing in a direction along a transmission direction of an optical signal at an optical interface and having different heights. The first electrode and the second electrode are provided on the insulating body so as to have a thickness from the first front edge surface and the second front edge surface in a direction of the height. A first flexible wiring board and a second flexible wiring board include a first area and a second area extending in directions along the first front edge surface and the second front edge surface, respectively, of the insulating body, and include, in the first area and the second area, first pads and second pads electrically connected with the first electrodes and the second electrodes.

11 Claims, 9 Drawing Sheets

(56) References Cited

U.S. PATENT DOCUMENTS

| | | | |
|---|---|---|---|
| 2003/0221313 A1* | 12/2003 | Gann | H01L 23/3114 |
| | | | 29/840 |
| 2004/0069997 A1* | 4/2004 | Dair | G02B 6/4214 |
| | | | 257/81 |
| 2010/0006863 A1* | 1/2010 | Ban | H01L 31/0203 |
| | | | 257/81 |
| 2010/0215324 A1* | 8/2010 | Ban | G02B 6/4201 |
| | | | 385/88 |
| 2010/0285676 A1* | 11/2010 | Ikeuchi | H01R 12/62 |
| | | | 439/65 |
| 2011/0008056 A1* | 1/2011 | Yagisawa | G02B 6/4201 |
| | | | 398/182 |
| 2012/0008289 A1 | 1/2012 | Aruga et al. | |

* cited by examiner

OPTICAL MODULE

CROSS-REFERENCE TO RELATED APPLICATION

The present application claims priority from Japanese application JP2015-060524 filed on Mar. 24, 2015, the content of which is hereby incorporated by reference into this application.

BACKGROUND OF THE INVENTION

1. Field of the Invention

The present invention relates to an optical module.

2. Description of the Related Art

An optical reception module or optical transmission module used in the present market of optical communications has generally the form of a coaxial type package or box type package. In the package, a light-receiving element or/and a light-emitting element, and a modulating element and an amplifier IC or the like, if needed, are contained. Moreover, a lens, a fiber, and the like are accommodated in the package for inputting/outputting an optical signal from/to the outside. For example, in the optical reception module, the beam spot of an optical signal input through an optical fiber is narrowed by a lens, and thereafter converted to an electric signal through photo electric conversion at an absorbing layer (light-receiving portion) of a light-receiving element.

This electric signal is generally as feeble as approximately several microamperes to several milliamperes. Therefore, the electric signal is amplified in a transimpedance amplifier IC, and output as a voltage signal from the optical reception module.

In recent years, a communication capacity required for per optical module is increased with an increase in communication rate, so that optical transmission/reception modules having a transmission rate of approximately 40 Gbps or 100 Gbps are demanded. In the optical transmission/reception modules, a multichannel system such as 10 Gbps×4 ch or 25 Gbps×4 ch may be used, and, for example, a multichannel optical module that inputs/outputs modulated optical signals at four wavelengths is known.

In the optical module, an optical element including reception portions or light-emitting portions corresponding to the number of a plurality of channels, or a driver IC, transimpedance IC, or the like including amplifiers corresponding to the number of the plurality of channels is mounted.

Therefore, input/output electric signals corresponding to the plurality of channels are needed, and also the numbers of power supplies, grounds, biases, and inputs/outputs of a control signal are great. In the optical module, electrical connection between the interior of the package and the outside is generally made through a transmission line pattern wired on a ceramic substrate attached to the package and a flexible board connected to the transmission line pattern with solder or the like. An example of such an optical module is disclosed in JP 2012-018289 A.

An optical module disclosed in JP 2012-018289 A is configured such that one flexible board is bent in a U shape near the substantial center thereof, and that a first pattern and a second pattern are patterned on the facing flexible board.

The optical module using the flexible board is one of configurations best suited for the multichannel optical module. That is, it is possible to dispose input/output electric signals corresponding to the plurality of channels on the flexible board and configure patterns for the plurality of power supplies, grounds, biases, or control signals on the flexible board.

Here, it is generally desired in a high-speed optical module to suppress, for example, crosstalk that causes malfunction. For example, JP 2012-018289 A, in which the first pattern and the second pattern are wired on the same flexible board, discloses a technique for suppressing crosstalk between these first wiring pattern and second wiring pattern.

Specifically, it is disclosed that a portion of a grounding conductor pattern is located between the first wiring pattern and the second wiring pattern facing the first wiring pattern when the flexible board is bent in a U shape. Thus, the crosstalk between the first wiring pattern and the second wiring pattern is suppressed.

In the optical module described above, the technique for suppressing the crosstalk between the first wiring pattern and the second wiring pattern is insufficient, and thus involves the problem of malfunction or the like of the optical module due to noise or the like.

The reason is as follows. Both the first wiring pattern and the second wiring pattern need to be connected using a conductive adhesive to a feedthrough portion constituting the optical module. Therefore, the first wiring pattern and the second wiring pattern are close to each other in the vicinity of their portions fixed at the feedthrough portion, and thus electrical crosstalk is caused in the vicinity of the portions.

For maintaining the fixing strength between the wiring pattern and the feedthrough, the conductor width of the wiring pattern generally needs to be widened to increase the bonding area. Actually, in the known example described above, a connection pad of the feedthrough is greater than the wiring pattern of the flexible board.

That is, the pad size of the first wiring pattern and the second wiring pattern is increased in the vicinity of the position at which the first wiring pattern and the second wiring pattern are fixed to the feedthrough, the wiring patterns are close to each other, and thus electrical crosstalk is caused in the vicinity of the position.

SUMMARY OF THE INVENTION

It is an object of the invention to reduce electrical crosstalk, reduce malfunctions, and enable high-quality transmission characteristics.

(1) An optical module according to an aspect of the invention includes: an optical sub-assembly for converting an optical signal and an electric signal at least from one to the other; and a flexible wiring board electrically connecting to the optical sub-assembly, wherein the optical sub-assembly includes an optical interface and an electrical interface provided on the sides opposite to each other, the electrical interface includes an insulating body and a plurality of electrodes, the insulating body including a plurality of front edge surfaces facing in a direction along a transmission direction of the optical signal at the optical interface and having different heights, the plurality of electrodes being provided on the insulating body so as to have a thickness or length from the plurality of front edge surfaces in a direction of the height, and the flexible wiring board includes a plurality of areas extending in directions along the plurality of front edge surfaces of the insulating body, and includes, in the plurality of areas, a plurality of pads electrically connected with the plurality of electrodes. According to the aspect of the invention, the heights of the plurality of front edge surfaces are different. Therefore, a connecting portion between the electrode and the pad on any of the front edge surfaces and a connecting portion between the electrode and the pad on the next front edge surface are distant from each other, so that crosstalk is reduced.

(2) In the optical module according to (1), the plurality of front edge surfaces may include a first front edge surface and a second front edge surface, the plurality of electrodes may include a plurality of first electrodes provided corresponding to the first front edge surface and a plurality of second electrodes provided corresponding to the second front edge surface, the plurality of areas may include a first area and a second area, and the plurality of pads may include a plurality of first pads provided in the first area and a plurality of second pads provided in the second area.

(3) In the optical module according to (2), the plurality of first pads may be arranged in at least one row, the plurality of second pads may be arranged in at least one row parallel to an arrangement direction of the plurality of first pads, the flexible wiring board may include first wiring patterns extending from the plurality of first pads in a first direction and second wiring patterns extending from the plurality of second pads in a second direction, and the first direction and the second direction may be directions crossing the arrangement direction of the plurality of first pads or the plurality of second pads, and opposite to each other.

(4) In the optical module according to (1) or (2), the flexible wiring board may include wiring patterns provided on one surface and a planar pattern provided on the other surface, and the plurality of pads may be connected to the wiring patterns and the planar pattern.

(5) In the optical module according to (4), the plurality of pads may include pad groups connected to the wiring patterns and at least one pad connected to the planar pattern, and one of the pad groups connected to the wiring patterns and the at least one pad connected to the planar pattern may be next to each other in a staggered arrangement.

(6) In the optical module according to any one of (1) to (5), the plurality of electrodes may be provided on the plurality of front edge surfaces of the insulating body, and the flexible wiring board may include the plurality of areas at positions overlapping the plurality of front edge surfaces of the insulating body.

(7) In the optical module according to (6), the flexible wiring board may include the plurality of pads on at least one of a surface facing the plurality of front edge surfaces of the insulating body and a surface on the side opposite to the surface.

(8) In the optical module according to any one of (1) to (5), the insulating body may include a plurality of side surfaces extending in the transmission direction of the optical signal to be adjacent to the plurality of front edge surfaces, the plurality of electrodes may be lead pins provided on the plurality of side surfaces of the insulating body, and the lead pins may penetrate the plurality of pads of the flexible wiring board.

(9) In the optical module according to any one of (1) to (8), the flexible wiring board may be separated into a plurality of wiring boards corresponding to the plurality of areas.

(10) In the optical module according to any one of (1) to (9), the plurality of pads may be provided on both surfaces of the flexible wiring board, the flexible wiring board may include a plurality of through holes formed of a conductive material, and each of the plurality of through holes may be formed so as to penetrate a pair of the pads provided on the both surfaces of the flexible wiring board.

(11) In the optical module according to any one of (1) to (10), the optical module may further include solder or a conductive adhesive for electrically connecting and fixing the plurality of pads and the plurality of electrodes together.

DETAILED DESCRIPTION OF THE INVENTION

Figure 1:
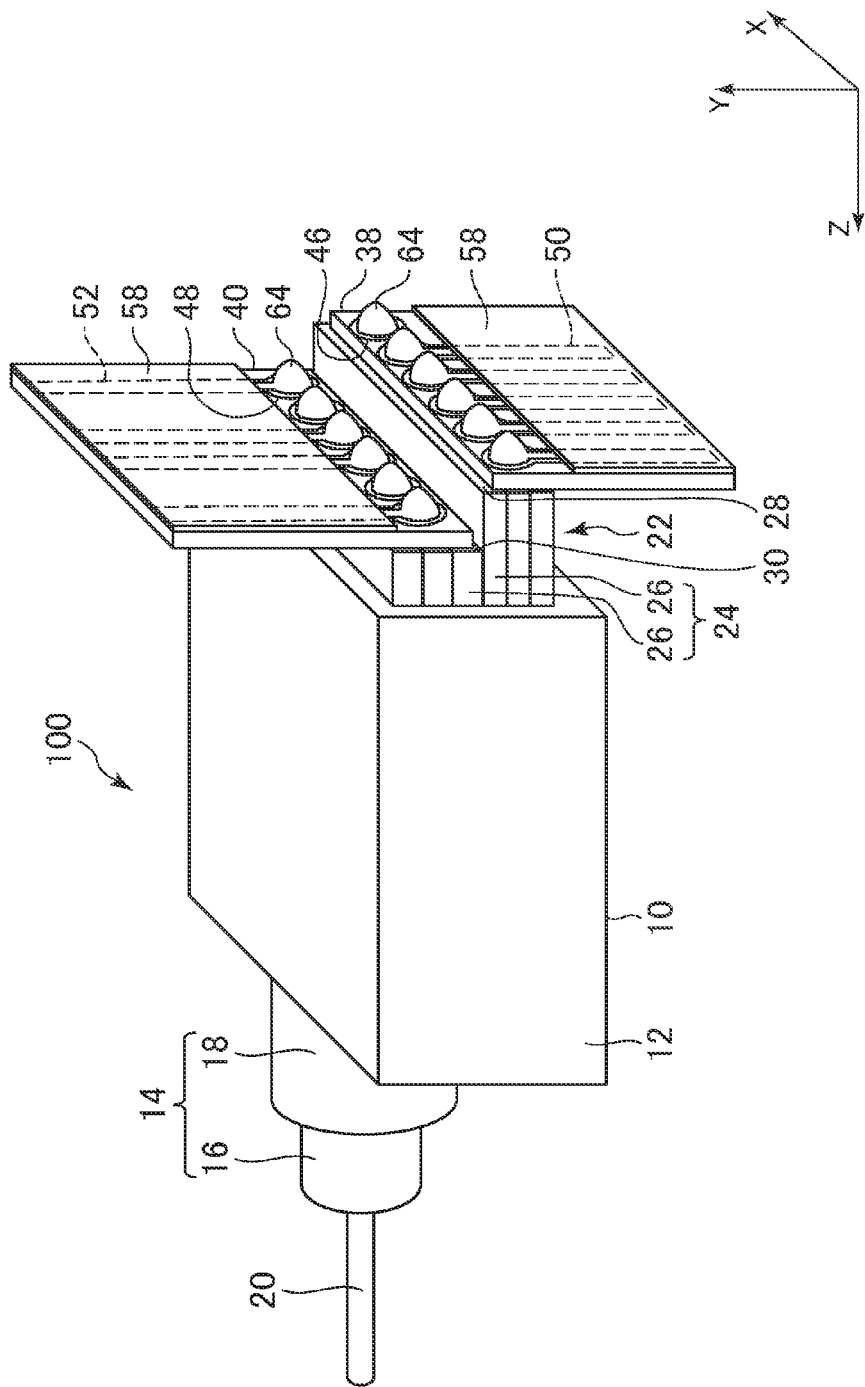
FIG. 1 is a perspective view for explaining an outline of an optical module of a first embodiment of the invention.

Hereinafter, embodiments of the invention will be described with reference to the drawings. In regard to the drawings, the same or equivalent components are denoted by the same reference numerals and signs, and a redundant description is omitted.

First Embodiment

FIG. 1 is a perspective view for explaining an outline of an optical module of a first embodiment of the invention. The optical module 100 includes an optical sub-assembly 10 for converting an optical signal and an electric signal at least from one to the other. Examples of the optical sub-assembly 10 include: an optical transmission module (transmitter optical sub-assembly (TOSA)) that includes a light-emitting element such as a laser therein, coverts an electric signal to an optical signal, and transmits the optical signal; an optical reception module (receiver optical sub-assembly (ROSA)) that includes a light-receiving element represented by a photodiode therein, and converts a received optical signal to an electric signal; and a bidirectional optical sub-assembly (BOSA) having the functions of the TOSA and the ROSA. As described above, the optical sub-assembly 10 is configured to convert an electric signal and an optical signal at least from one to the other.

The optical sub-assembly 10 includes a package 12 made of metal, ceramic, or the like. The package 12 is provided with an optical interface 14. The optical interface 14 includes an optical fiber holder 16 and a lens holder 18, and an optical signal from an optical fiber 20 is input/output through the optical interface 14.

An electrical interface 22 is provided on the side of the package 12 opposite to the optical interface 14. The electrical interface 22 is, for example, a feedthrough for transmitting or/and receiving an electric signal in a state where the hermeticity of the package 12 is maintained. The electrical interface 22 includes an insulating body 24. The insulating body 24 is made of, for example, ceramic, and composed of a plurality of layers 26 stacked on one another.

The insulating body 24 (the plurality of layers 26) includes a surface extending in a direction (direction along the Z-axis) along the transmission direction of an optical signal at the optical interface 14, and this direction is the transmission direction of an electric signal at the electrical interface 22.

Figure 2:
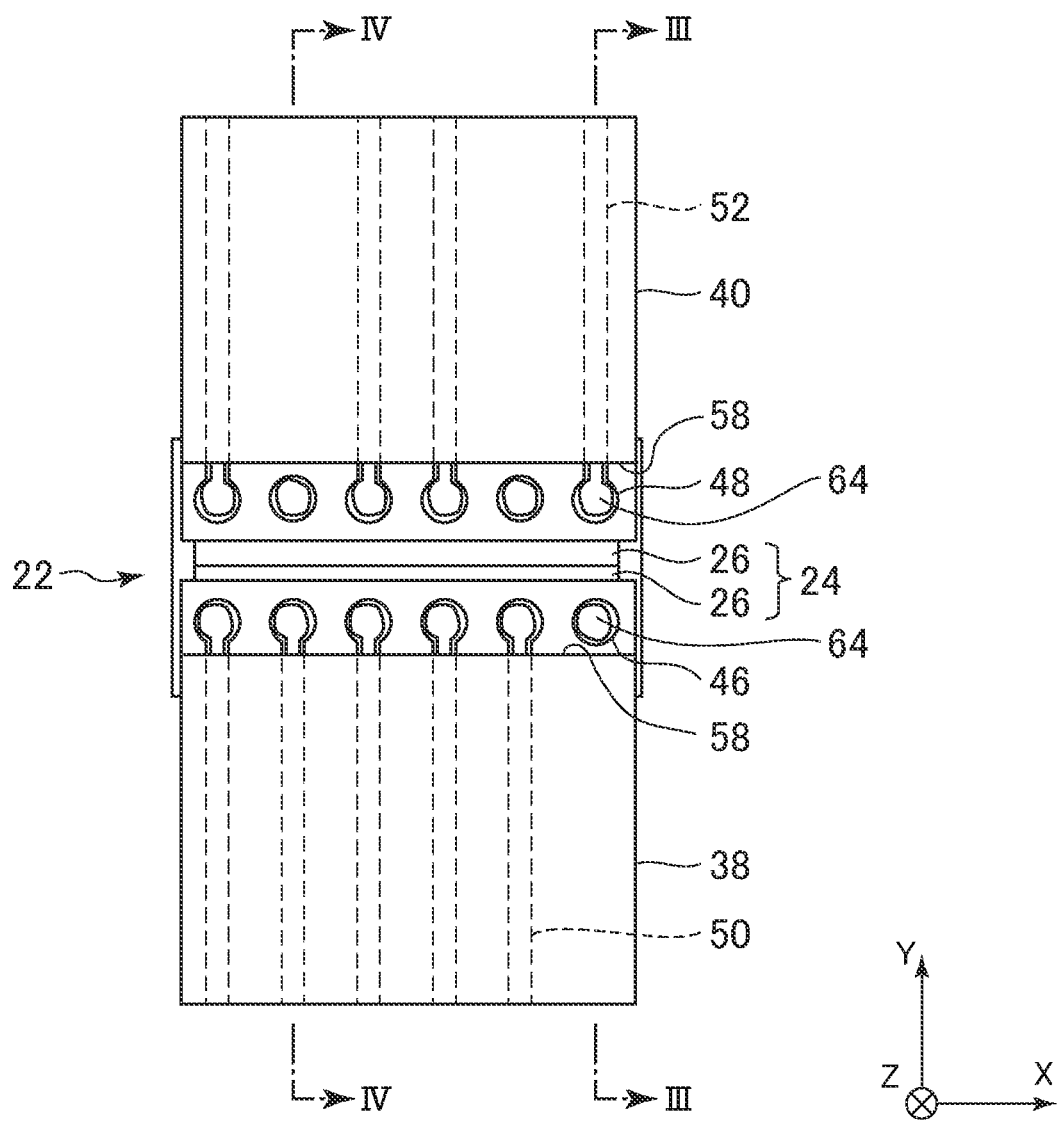
FIG. 2 is a diagram of the optical module shown in FIG. 1, as viewed along the Z-axis.
Figure 3:
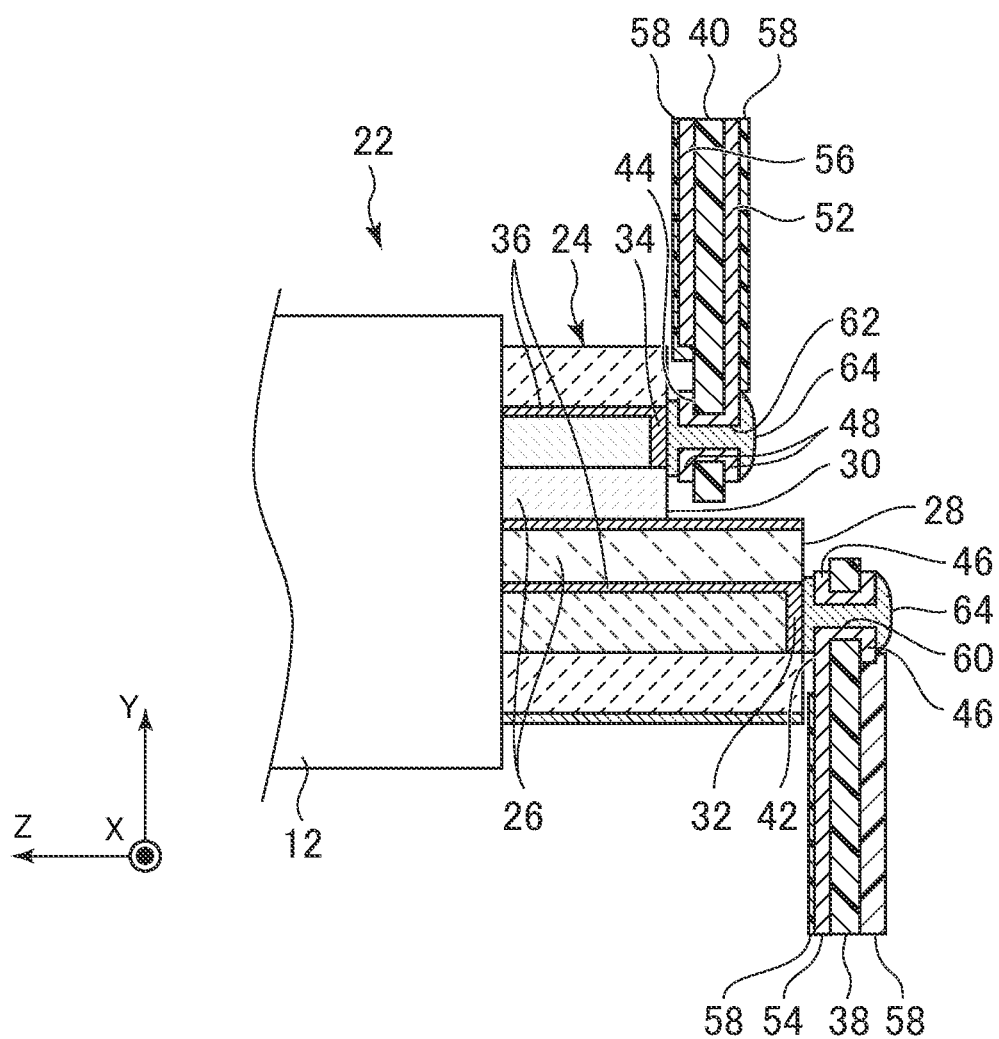
FIG. 3 is a cross-sectional view of the optical module taken along the line III-III shown in FIG. 2.
Figure 4:
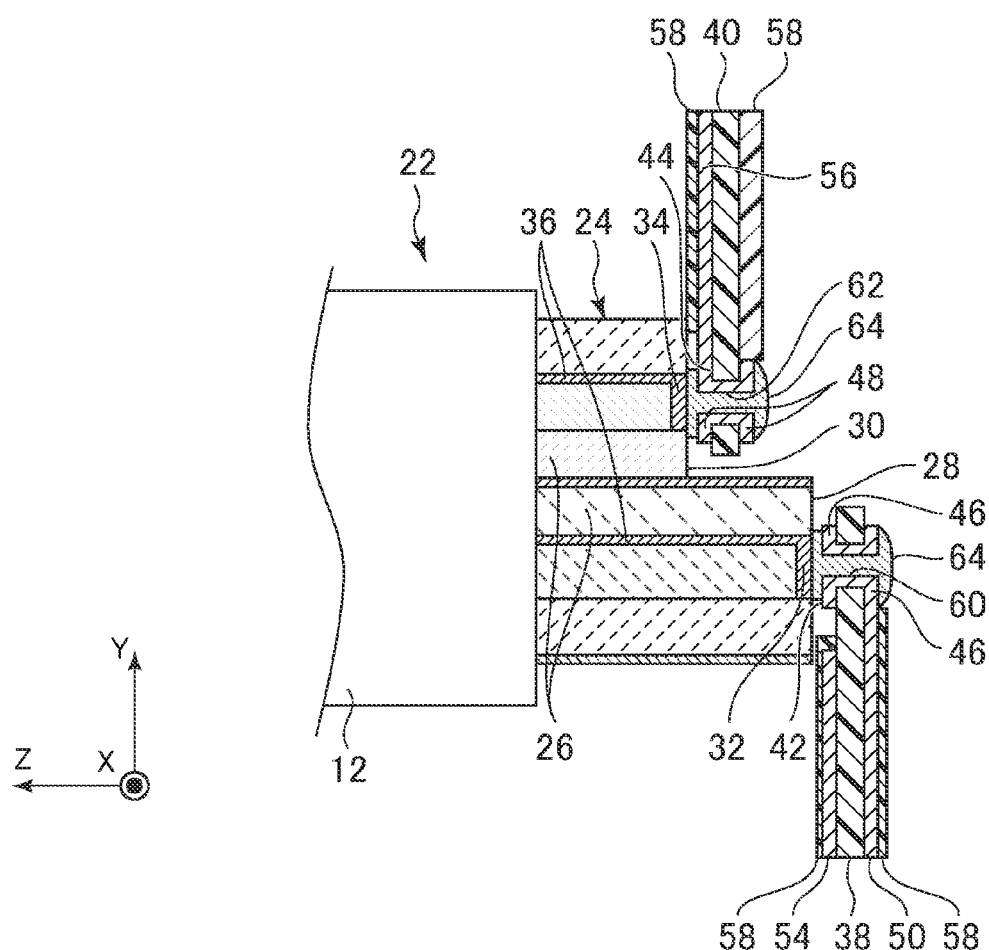
FIG. 4 is a cross-sectional view of the optical module taken along the line IV-IV shown in FIG. 2.

FIG. 2 is a diagram of the optical module shown in FIG. 1, as viewed along the Z-axis. FIG. 3 is a cross-sectional view of the optical module taken along the line III-III shown in FIG. 2. FIG. 4 is a cross-sectional view of the optical module taken along the line IV-IV shown in FIG. 2.

The insulating body 24 includes a plurality of front edge surfaces (for example, a first front edge surface 28 and a second front edge surface 30). The first front edge surface 28 and the second front edge surface 30 face in the direction (direct ion along the Z-axis) along the transmission direction of an optical signal at the optical interface 14 shown in FIG. 1, and have different heights in the direction. That is, the insulating body 24 (the plurality of layers 26) forms steps.

The electrical interface 22 includes a plurality of electrodes (for example, a plurality of first electrodes 32 and a plurality of second electrodes 34). The first electrode 32 and the second electrode 34 are made of gold or the like, and are provided on the first front edge surface 28 and the second front edge surface 30, respectively, of the insulating body 24. The first electrode 32 and the second electrode 34 have a thickness from the first front edge surface or the second front edge surface 30 in a direction (direction along the Z-axis) of the height.

The first electrode 32 and the second electrode 34 are connected to wires 36 for electrically connecting with the interior of the package 12. The wires 36 extend in the transmission direction (direction along the Z-axis) of an electric signal at the electrical interface 22. The wires 36 are formed in the layers 26 of the insulating body 24.

The optical module 100 includes flexible wiring boards (for example, a first flexible wiring board 38 and a second flexible wiring board 40 separated from each other). As shown in FIGS. 3 and 4, the flexible wiring boards include a plurality of areas (for example, a first area 42 and a second area 44). The first flexible wiring board 38 includes the first area 42, and the second flexible wiring board 40 includes the second area 44. The first area 42 extends in a direction along the first front edge surface 28 of the insulating body 24, and is located at a position overlapping the first front edge surface 28. The second area 44 extends in a direction along the second front edge surface 30 of the insulating body 24, and is located at a position overlapping the second front edge surface 30.

The first flexible wiring board 38 includes a plurality of first pads 46. The plurality of first pads 46 are provided in the first area 42. As shown in FIG. 1 or 2, the plurality of first pads 46 are arranged in at least one row (for example, a direction along the X-axis). As shown in FIGS. 3 and 4, the plurality of first pads 46 are provided on at least one (in the embodiment, both) of a surface of the first flexible wiring board 38 facing the first front edge surface 28 of the insulating body 24 and a surface of the first flexible wiring board 38 on the side opposite to the above-described surface.

The second flexible wiring board 40 includes a plurality of second pads 48. The plurality of second pads 48 are provided in the second area 44. As shown in FIG. 1 or 2, the plurality of second pads 48 are arranged in at least one row (for example, the direction along the X-axis) parallel to the arrangement direction of the plurality of first pads 46. As shown in FIGS. 3 and 4, the plurality of second pads 48 are provided on at least one (in the embodiment, both) of a surface of the second flexible wiring board 40 facing the second front edge surface 30 of the insulating body 24 and a surface of the second flexible wiring board 40 on the side opposite to the above-described surface.

The first flexible wiring board 38 includes on one surface thereof first wiring patterns 50. The second flexible wiring board 40 includes on one surface thereof second wiring patterns 52. The first wiring pattern 50 and the second wiring pattern 52 include power supply wires or/and signal wires. The first wiring patterns 50 extend from the plurality of first pads 46 in a first direction (Y-axis negative direction). The second wiring patterns 52 extend from the plurality of second pads 48 in a second direction (Y-axis positive direction). The first direction (Y-axis negative direction) and the second direction (Y-axis positive direction) are directions crossing the arrangement direction (direction along the X-axis) of the plurality of first pads 46 or the plurality of second pads 48. The first direction and the second direction are directions opposite to each other.

The first flexible wiring board 38 includes on the other surface (surface facing the insulating body 24) thereof a first planar pattern 54. The second flexible wiring board includes on the other surface (surface facing the insulating body 24) thereof a second planar pattern 56. The first planar pattern 54 and the second planar pattern 56 are connected to a reference potential (for example, the ground).

At least one (both in the example of FIG. 3) of the first wiring pattern 50 and the first planar pattern 54 is covered and protected by a cover layer 58. At least one (both in the example of FIG. 3) of the second wiring pattern 52 and the second planar pattern 56 is covered and protected by a cover layer 58. The material of the cover layer 58 is resin, and may be a resist material.

Some of the plurality of first pads 46 are connected to the first wiring patterns 50 (FIG. 4). Some of the plurality of second pads 48 are connected to the second wiring patterns 52 (FIG. 3). At least one of the plurality of first pads 46 is connected to the first planar pattern 54 (FIG. 3). At least one of the plurality of second pads 48 is connected to the second planar pattern 56 (FIG. 4).

The first flexible wiring board 38 includes a plurality of first through holes 60 formed of a conductive material. Each of the plurality of first through holes 60 penetrates a pair of first pads 46 provided on the both surfaces of the first flexible wiring board 38. The second flexible wiring board 40 includes a plurality of second through holes 62 formed of a conductive material. Each of the plurality of second through holes 62 penetrates a pair of second pads 48 provided on the both surfaces of the second flexible wiring board 40.

The first flexible wiring board 38 is electrically connected to the optical sub-assembly 10. The plurality of first pads 46 are electrically connected with the plurality of first electrodes 32. The plurality of first pads 46 and the plurality of first electrodes 32 are electrically connected and fixed together with solder 64. The presence of the first through hole 60 facilitates the conduction of heat of a soldering iron from the first pad 46 to the first electrode 32. When the solder 64 is provided on the first pad 46 and melted by heat on the side opposite to the first electrode 32, the solder 64 passes through the first through hole 60 and flows in between the first pad 46 on the opposite side and the first electrode 32. Alternatively, a conductive adhesive may be used instead of the solder 64.

The second flexible wiring board 40 is electrically connected to the optical sub-assembly 10. The plurality of second pads 48 are electrically connected with the plurality of second electrodes 34. The plurality of second pads 48 and the plurality of second electrodes 34 are electrically connected and fixed together with the solder 64. The presence of the second through hole 62 facilitates the conduction of heat of a soldering iron from the second pad 48 to the second electrode 34. When the solder 64 is provided on the second pad 48 and melted by heat on the side opposite to the second electrode 34, the solder 64 passes through the second through hole 62 and flows in between the second pad 48 on the opposite side and the second electrode 34. Alternatively, a conductive adhesive may be used instead of the solder 64.

As shown in FIG. 2, a connecting portion between the first electrode 32 and the first pad 46 and a connecting portion between the second electrode 34 and the second pad 48 on the next second front edge surface 30 are separate in the Y-axis direction. First, in this regard, crosstalk is reduced. Further, according to the embodiment as shown in FIGS. 1 and 3, the heights of the first front edge surface 28 and the second front edge surface 30 are different in the Z-axis direction. Therefore, the connecting portion between the first electrode 32 and the first pad 46 on the first front edge surface 28 and the connect ing portion between the second electrode 34 and the second pad 48 on the next second front edge surface 30 are distant from each other in the Z-axis direction, so that crosstalk can be further reduced.

Further, as shown in FIGS. 1 and 3, the first flexible wiring board 38 and the second flexible wiring board 40 are connected vertically to the insulating body 24 (feedthrough) in the direction along the Z-axis, and also, the first flexible wiring board 38 and the second flexible wiring board 40 are disposed so as to extend in directions different from each other. With this disposition, the first wiring pattern 50 and the second wiring pattern 52 contiguous to the above-described two connecting portions (the connecting portion between the first electrode 32 and the first pad 46 and the connecting portion between the second electrode 34 and the second pad 48 on the next second front edge surface 30) can be distant from each other in the Y-axis direction also subsequent to the two connecting portions, so that this disposition has an advantageous effect also on a reduction in crosstalk between the wiring patterns. Here, the flexible wiring boards may be used differently such that the first flexible wiring board 38 transmits a high-frequency signal and the second flexible wiring board 40 transmits only a DC signal.

Second Embodiment

Figure 5:
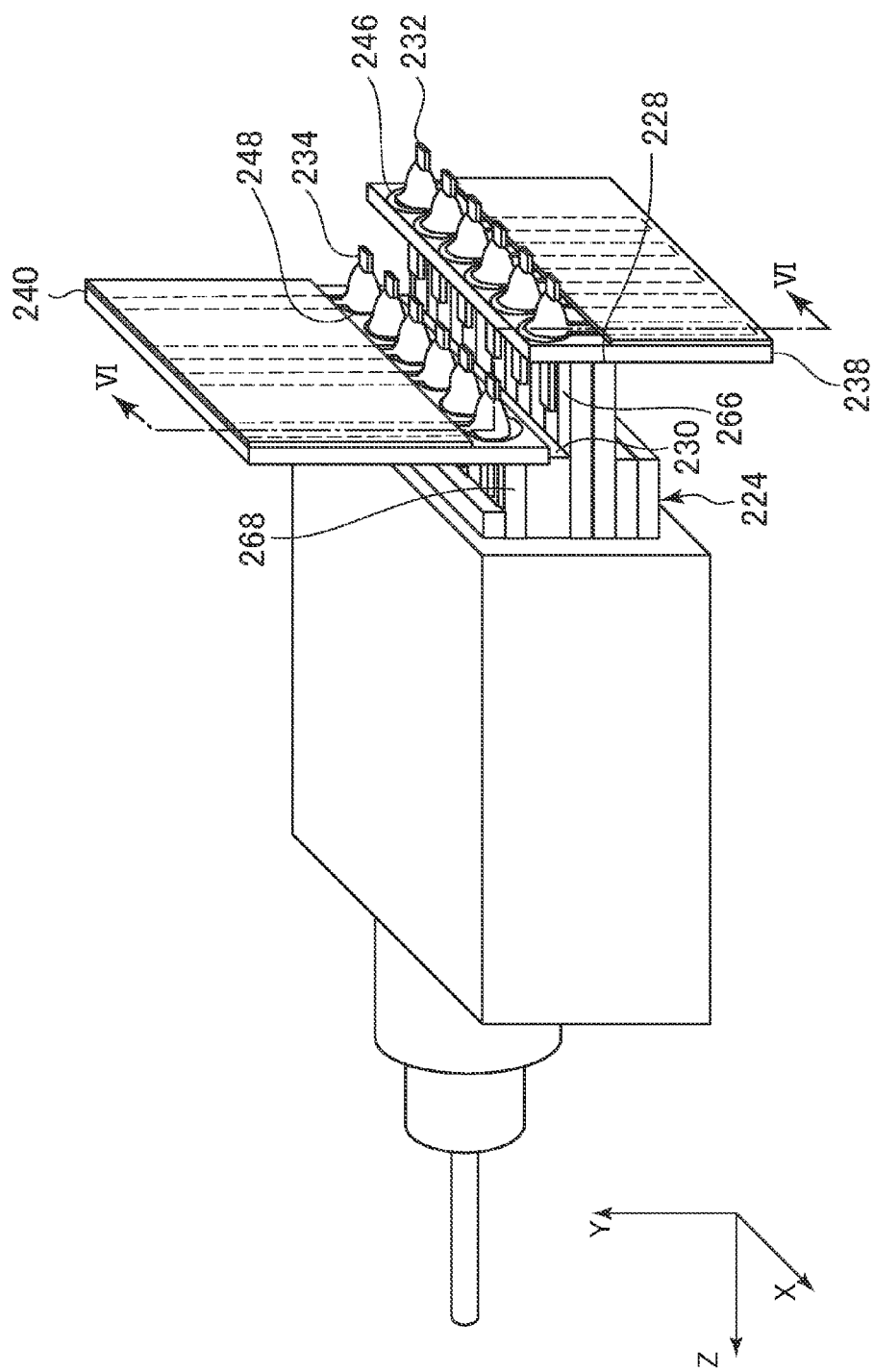
FIG. 5 is a perspective view for explaining an outline of an optical module of a second embodiment of the invention.
Figure 6:
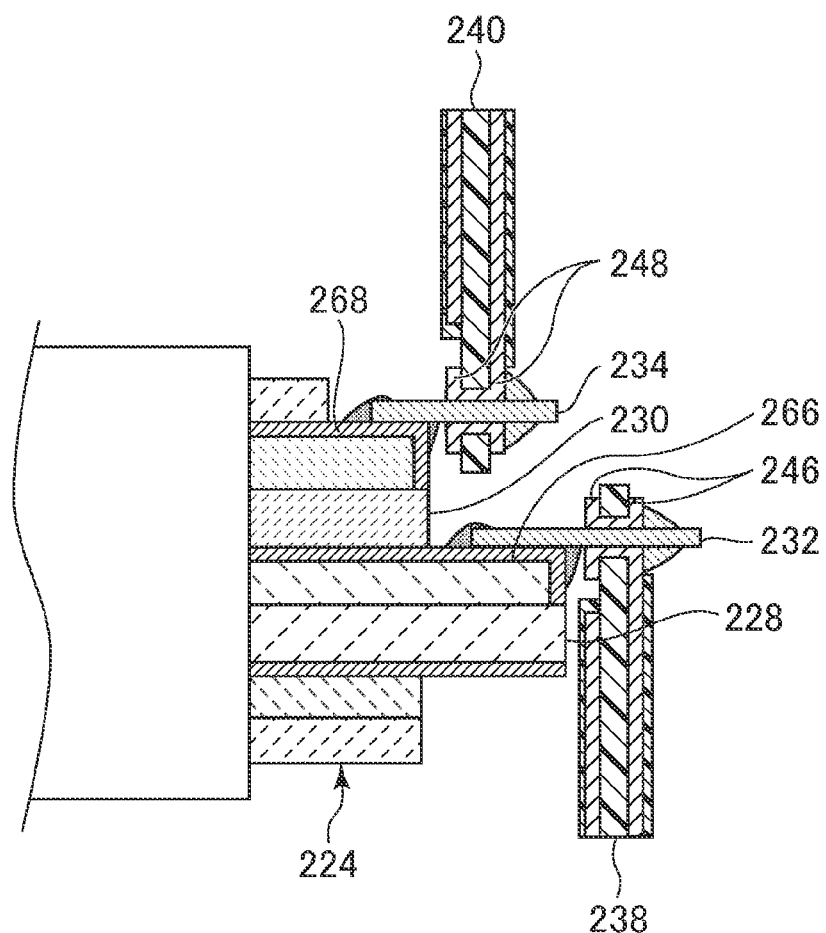
FIG. 6 is a cross-sectional view of the optical module taken along the line VI-VI shown in FIG. 5.

FIG. 5 is a perspective view for explaining an outline of an optical module of a second embodiment of the invention. FIG. 6 is a cross-sectional view of the optical module taken along the line VI-VI shown in FIG. 5.

An insulating body 224 includes a first side surface 266 extending in the transmission direction of an optical signal and an electric signal to be adjacent to a first front edge surface 228. Each of a plurality of first electrodes 232 is a first lead pin provided on the first side surface 266. The first electrode 232 as the first lead pin penetrates each of a plurality of first pads 246 of a first flexible wiring board 238.

The insulating body 224 includes a second side surface 268 extending in the transmission direction of an optical signal and an electric signal to be adjacent to a second front edge surface 230. Each of a plurality of second electrodes 234 is a second lead pin provided on the second side surface 268. The second electrode 234 as the second lead pin penetrates each of a plurality of second pads 248 of a second flexible wiring board 240.

The first electrode 232 (first lead pin) and the second electrode 234 (second lead pin) have a length from the first front edge surface 228 or the second front edge surface 230 in the direction (direction along the Z-axis) of the height.

As shown in FIGS. 5 and 6, a connecting portion between the first electrode 232 (first lead pin) and the first pad 246 and a connect ing portion between the next second electrode 234 (second lead pin) and second pad 248 are separate in the Y-axis direction and also separate in the Z-axis direction, so that crosstalk between the two connecting portions can be reduced.

The content described in the first embodiment can be applied to the other structures of the embodiment.

Third Embodiment

Figure 7:
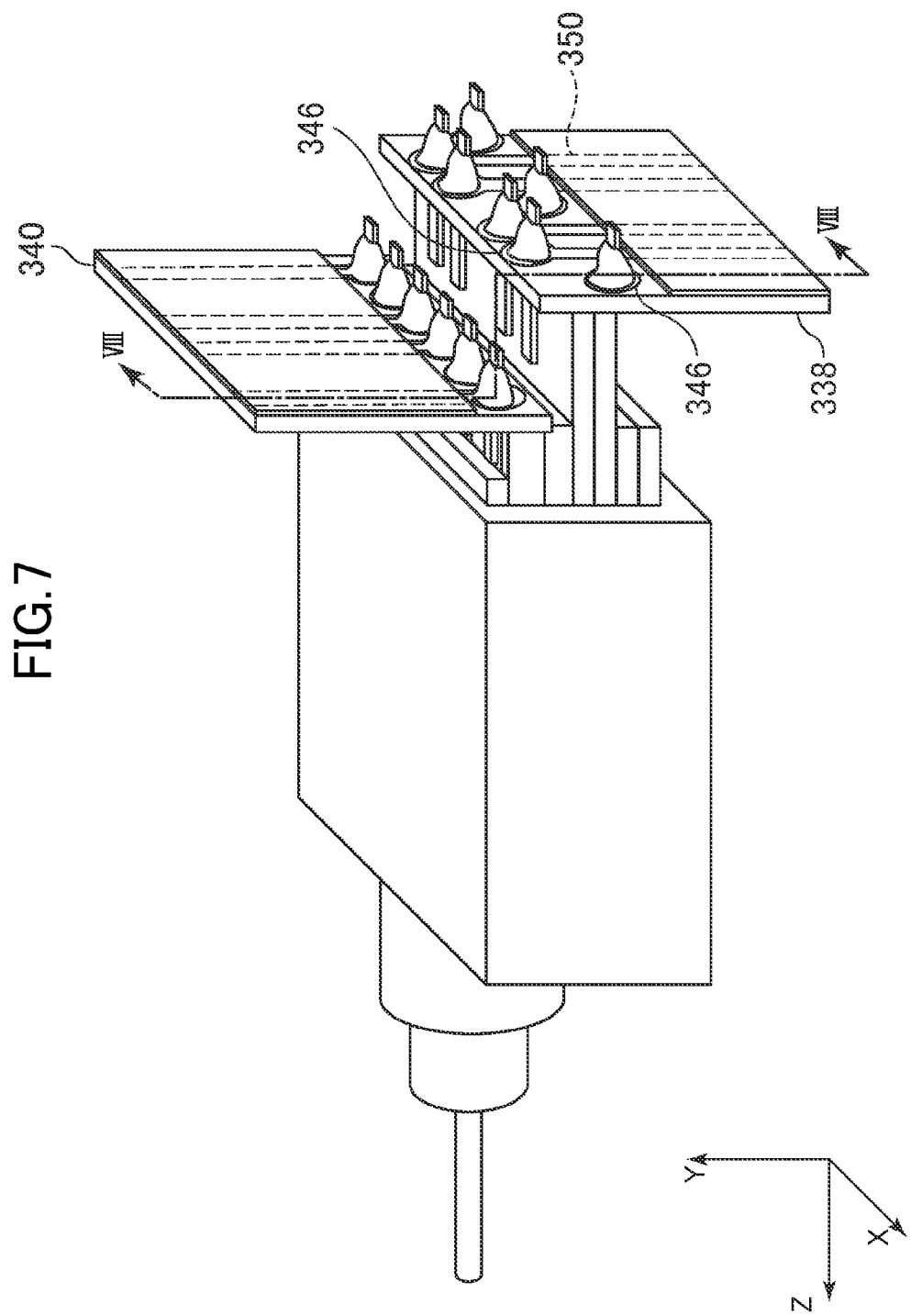
FIG. 7 is a perspective view for explaining an outline of an optical module of a third embodiment of the invention.
Figure 8:
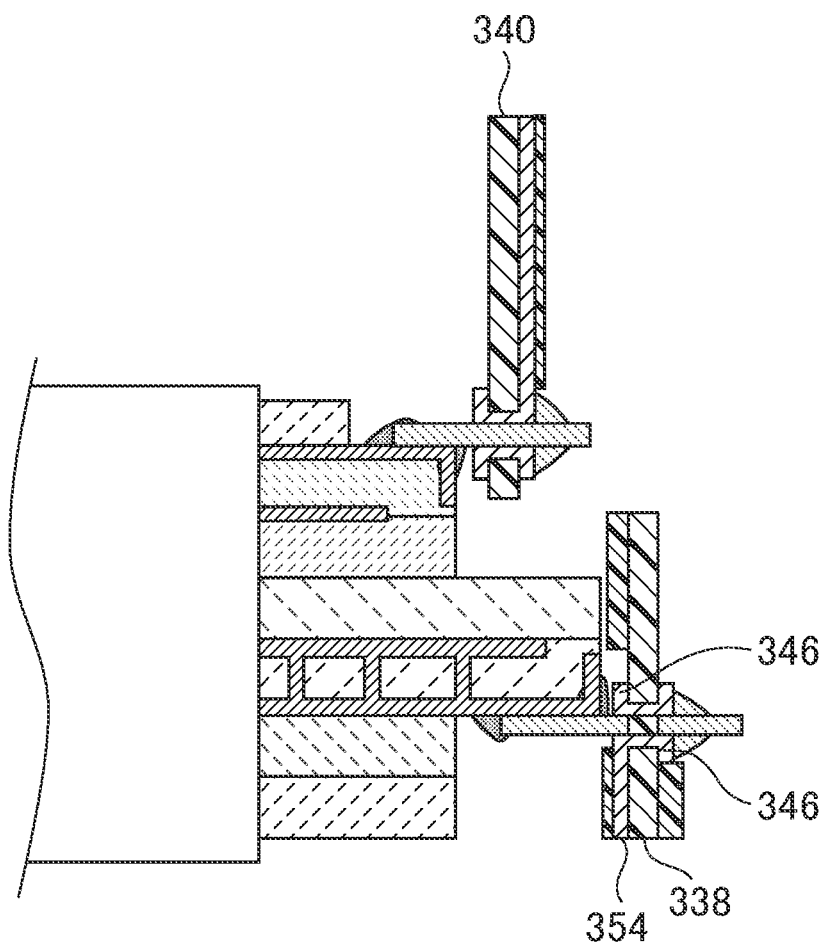
FIG. 8 is a cross-sectional view of the optical module taken along the line VIII-VIII shown in FIG. 7.

FIG. 7 is a perspective view for explaining an outline of an optical module of a third embodiment of the invention. FIG. 8 is a cross-sectional view of the optical module taken along the line VIII-VIII shown in FIG. 7.

Some of a plurality of first pads 346 are connected to first wiring patterns 350. At least one of the plurality of first pads 346 is connected to a first planar pattern 354. The first pad 346 connected to the first wiring pattern 350 and the first pad 346 connected to the first planar pattern 354 are next to each other in a staggered arrangement.

The content described in the second embodiment can be applied to the other structures of the embodiment. As a modified example, the staggered arrangement of a first flexible wiring board 338 may be applied to a second flexible wiring board 340. That is, a second pad connected to a second wiring pattern and a second pad connected to a second planar pattern may be arranged so as to be next to each other in a staggered arrangement.

Fourth Embodiment

Figure 9:
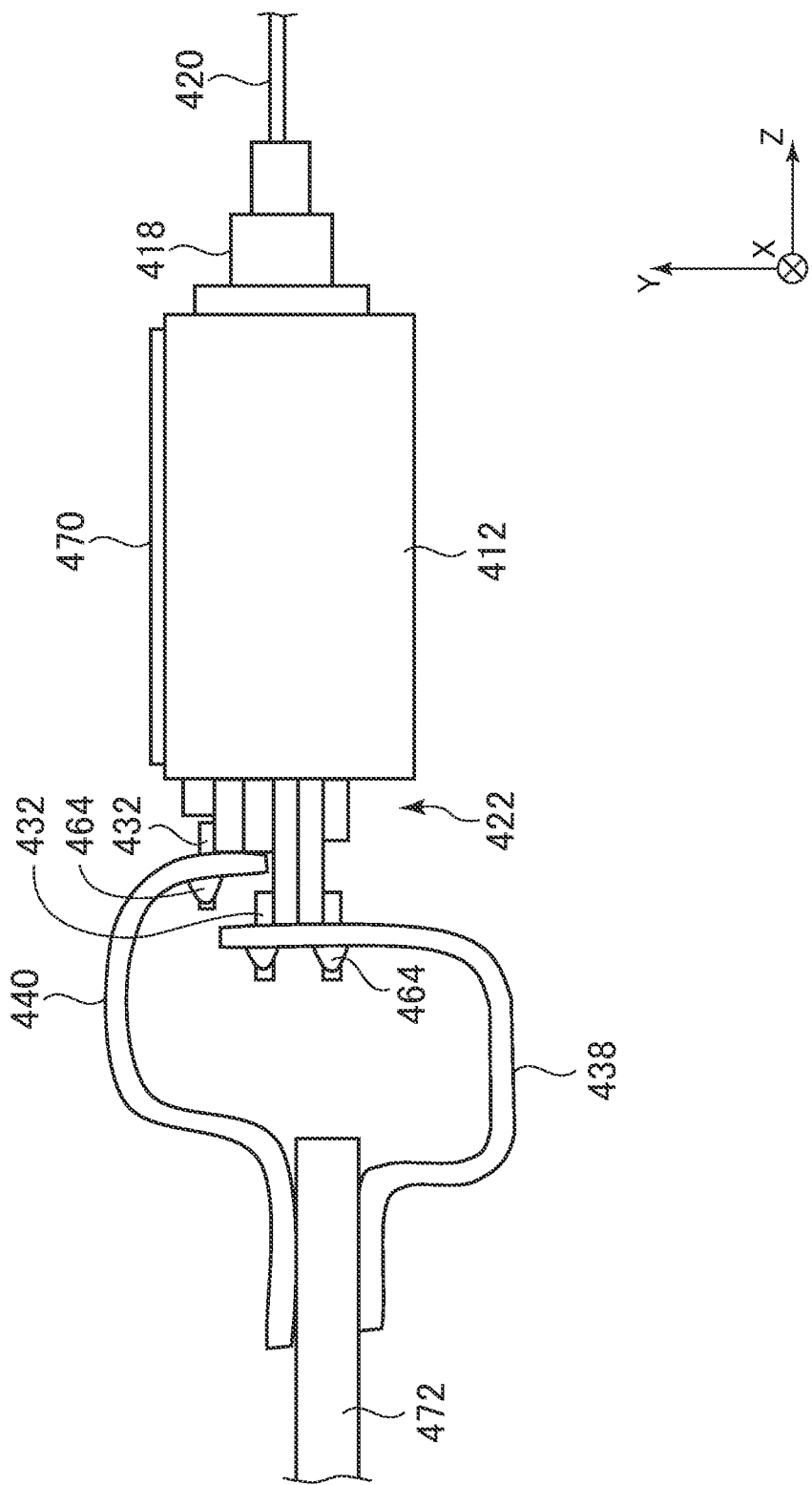
FIG. 9 is an overall view of an optical module according to a fourth embodiment of the invention.

FIG. 9 is an overall view of an optical module according to a fourth embodiment of the invention, especially showing the whole of flexible wiring boards (a first flexible wiring board 438 and a second flexible wiring board 440).

The optical module includes, as main components, an optical fiber 420 for inputting/outputting an optical signal, a package 412, a feedthrough 422 for outputting an electric signal, the first flexible wiring board 438, and the second flexible wiring board 440.

In the case of an optical reception module, an optical signal input via the optical fiber 420 is converted to condensed light or collimated light by a lens fixed to a lens holder 418, passes through an optical component contained in the package 412, and is converted by a photodiode from the optical signal to an electric signal. This electric signal is amplified by an amplifier IC or the like, and then output to the outside of the package 412 via the feedthrough made of an inorganic material such as ceramic.

An optical element and an electric element such as an IC contained in the package 412 are hermetically sealed by a lid 470. Lead pins 432 are mounted on patterns on the feedthrough 422, and fixed using solder 464 or the like to pads located atone end portion of each of the first flexible wiring board 438 and the second flexible wiring board 440.

The other end portion of each of the first flexible wiring board 438 and the second flexible wiring board 440 is fixed to a printed board 472 with solder or the like. A clock and data recovery (CDR) or waveform forming digital IC, an analog IC such as an amplifier or a driver, and, in addition, a control element or the like may be mounted on the printed board 472.

While there have been described what are at present considered to be certain embodiments of the invention, it will be understood that various modifications may be made thereto, and it is intended that the appended claims cover all such modifications as fall within the true spirit and scope of the invention.

For example, although the above-described embodiments have been described using two flexible wiring boards, one flexible wiring board may be used. Moreover, although the insulating body has been described using the form in which layers are stacked in the Y-axis direction, the layers may be stacked in the Z-axis direction.

What is claimed is:

1. An optical module comprising:
an optical sub-assembly for converting an optical signal and an electric signal at least from one to the other; and
a plurality of flexible wiring boards electrically connecting to the optical sub-assembly,
wherein the optical sub-assembly includes an optical interface and an electrical interface provided on sides opposite to each other,
wherein the electrical interface includes an insulating body and a plurality of electrodes, the insulating body including a plurality of front edge surfaces facing in a direction along a transmission direction of the optical signal at the optical interface, each of the plurality of front edge surfaces having a length in a length direction crossing the transmission direction and a width in a width direction crossing the transmission direction and being perpendicular to the length direction, the length being greater than the width, the plurality of front edge surfaces being aligned along the length direction and the plurality of front edge surfaces being at different heights along the transmission direction and in a stacked arrangement along the width direction, the plurality of electrodes being provided on the insulating body, the plurality of electrodes each having a thickness or length from the plurality of front edge surfaces in a direction of the height along the transmission direction, and
wherein the flexible wiring boards include a plurality of areas extending in directions along the plurality of front edge surfaces of the insulating body, and includes, in the plurality of areas, a plurality of pads electrically connected with the plurality of electrodes.

2. The optical module according to claim 1, wherein:
the plurality of front edge surfaces include a first front edge surface and a second front edge surface,
the plurality of electrodes include a plurality of first electrodes provided on the first front edge surface and a plurality of second electrodes provided on the second front edge surface,
the plurality of areas include a first area and a second area, and
the plurality of pads include a plurality of first pads provided in the first area and a plurality of second pads provided in the second area.

3. The optical module according to claim 2, wherein:
the plurality of first pads are arranged in at least one row,
the plurality of second pads are arranged in at least one row parallel to an arrangement direction of the plurality of first pads,
the flexible wiring boards include first wiring patterns extending from the plurality of first pads in a first direction and second wiring patterns extending from the plurality of second pads in a second direction, and
the first direction and the second direction are opposite to each other.

4. The optical module according to claim 1, wherein:
the flexible wiring boards include wiring patterns provided on a first surface thereof and a planar pattern provided on a second surface thereof, and
the plurality of pads are connected to the wiring patterns and the planar pattern.

5. The optical module according to claim 4, wherein:
the plurality of pads include pad groups connected to the wiring patterns and at least one pad connected to the planar pattern, and
one of the pad groups connected to the wiring patterns and the at least one pad connected to the planar pattern are next to each other in a staggered arrangement.

6. The optical module according to claim 1, wherein:
the plurality of electrodes are provided on each of the plurality of front edge surfaces of the insulating body, and
the flexible wiring boards include the plurality of areas at positions overlapping the plurality of front edge surfaces of the insulating body.

7. The optical module according to claim 6, wherein:
the flexible wiring boards include the plurality of pads on at least one of a first surface facing the plurality of front edge surfaces of the insulating body and a second surface opposite to the first surface.

8. The optical module according to claim 1, wherein:
the insulating body includes a plurality of side surfaces extending in the transmission direction of the optical signal to be adjacent to the plurality of front edge surfaces,
the plurality of electrodes are lead pins provided on the plurality of side surfaces of the insulating body, and
the lead pins penetrate the plurality of pads of the flexible wiring board.

9. The optical module according to claim 1, wherein:
the flexible wiring boards are separated corresponding to the plurality of areas.

10. The optical module according to claim 1, wherein:
the plurality of pads are provided on both a first surface and a second surface of the flexible wiring boards,
the flexible wiring boards include a plurality of through holes formed of a conductive material, and
each of the plurality of through holes is formed so as to penetrate a pair of the pads provided on both the first surface and the second surface of the flexible wiring boards.

11. The optical module according to claim 1, further comprising:
a solder or a conductive adhesive for electrically connecting and fixing the plurality of pads and the plurality of electrodes together.

\* \* \* \* \*